(12) United States Patent
Lundberg

(10) Patent No.: US 6,472,847 B2
(45) Date of Patent: Oct. 29, 2002

(54) BATTERY OPERABLE DEVICE WITH BATTERY STATE-OF-CHARGE INDICATOR

(75) Inventor: Marcus Lundberg, Stockholm (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 09/977,198

(22) Filed: Oct. 16, 2001

(65) Prior Publication Data

US 2002/0084771 A1 Jul. 4, 2002

Related U.S. Application Data

(60) Provisional application No. 60/241,851, filed on Oct. 20, 2000.

(30) Foreign Application Priority Data

Oct. 17, 2000 (EP) .............................................. 00610107

(51) Int. Cl.⁷ .............................................. H01M 10/46
(52) U.S. Cl. ..................................................... 320/132
(58) Field of Search ................................ 320/127, 128, 320/132, 134, 136, 149, DIG. 21

(56) References Cited

U.S. PATENT DOCUMENTS

| 3,984,762 | A | 10/1976 | Dowgiallo, Jr. |
| 4,743,855 | A | 5/1988 | Randin et al. |
| 5,369,364 | A | 11/1994 | Renirie et al. |
| 5,457,377 | A | 10/1995 | Jonsson |
| 5,717,336 | A | 2/1998 | Basell et al. |

FOREIGN PATENT DOCUMENTS

| DE | 2745003 | 4/1979 |
| WO | WO00/31557 | 6/2000 |

*Primary Examiner*—Edward H. Tso
(74) *Attorney, Agent, or Firm*—Burns, Doane, Swecker & Mathis, L.L.P.

(57) ABSTRACT

A battery operable electrical device, such as a mobile telephone or a laptop computer, with a clock frequency generator operable to generate electrical clock frequency signals, and a first electrical circuit adapted to perform a first or main function of the device, utilizing the clock frequency signals generated by the clock generator. The device further includes a second electrical or auxiliary circuit adapted to generate an electrical excitation signal with an excitation frequency derived from the clock frequency signals. The excitation signal is fed to battery terminals of the device, and the second electrical circuit receives, from a battery connected to the battery terminals, an electrical signal in response to the excitation signal, and to analyze the received signal for the battery impedance at the excitation frequency and, based on the battery impedance, the state-of-charge of the battery is estimated.

7 Claims, 2 Drawing Sheets

BATTERY OPERABLE DEVICE WITH BATTERY STATE-OF-CHARGE INDICATOR

This application claims priority under 35 U.S.C. §§119 and/or 365 to 00610107.5 filed in Europe on Oct. 17, 2000 and to No. 60/241,851 filed in The United States of America on Oct. 20, 2000; the entire content of which is hereby incorporated by reference.

The invention concerns a battery operable device having an indicator of the state-of-charge of a battery.

BACKGROUND OF THE INVENTION

In battery-operated devices, low battery and possible subsequent shut-off of the device are a great source of irritation to the user, especially when the timing of the event cannot be predicted. An indicator accurately showing remaining battery capacity, ie a state-of-charge indicator, enables the user to predict the event and is thus a great benefit to the user. The indicator is especially valuable at the end of the discharge.

The invention is useful for indicating the remaining battery power in battery operable devices, in particular in mobile telephones and laptop computers, which may possibly also be operable from an AC power supply, but also in computer or microprocessor based equipment intended for application where no AC power outlet is available or where, for other reasons, a battery is a preferred power source. The invention may also be useful in other applications where an apparatus is dependent on a battery, such as in an uninterruptible power supply (UPS) where a battery supplies DC power to eg a solid state electronic AC power generator in case of unintended or temporary AC power failure. The battery can be an internal or external battery or an exchangeable battery, and battery operation can be supplemented with the possibility of operation from an AC power source.

1. State-of-the-art

A number of different alternatives exist for state-of-charge indicators.

A first known method involves measurement of the voltage of the battery. On the assumption that the discharge curve of the battery is known, the measured battery voltage is used as an approximate indicator of the discharge state. This method is fairly simple and low cost and requires only very limited information regarding the battery. This method has a limited accuracy since the remaining battery power depends on other factors than the battery voltage alone.

A second known method involves an estimation of used battery capacity or power. The basic principle is that battery capacity is assumed to be known, and by measuring or estimating magnitude and duration of the current drawn from the battery, the remaining battery capacity can be calculated. This method can be implemented in software or in a combination of software and hardware. By implementing a hardware solution, which measures the actual current, accuracy is increased. However, this method too has limited accuracy.

A third known method involves measuring the impedance of a battery. The impedance of the battery changes continuously with the state-of-charge, and an estimation of remaining capacity can be made based on measurements of the change in impedance. The invention offers an improvement to this method, and the known method will therefore be described in the following.

There are two known ways of performing impedance measurements for tracking the change of the impedance over time for use in estimating the state-of-charge of the battery, one being an AC impedance measurement, the other being voltage/current step response. The impedance is defined as the voltage response to unit excitation current, or the ratio of resulting voltage to excitation current.

AC impedance is a complex quantity having two components: a real part and an imaginary part, or magnitude and phase. To measure the AC impedance an alternating current is applied to the battery, and the resulting voltage response is analysed by magnitude and phase or by real and imaginary parts. The AC impedance, whether expressed as real and imaginary parts or as magnitude and phase, depends on frequency. In a known method of estimating the state-of-charge of a battery the AC impedance of the battery is measured and analysed at several frequencies, and the analysis forms the basis for estimating the state-of-charge of a battery. This method requires a frequency generator such as a crystal based clock generator, which generates the necessary clock frequencies for the operation of processor. Frequency dividers and multipliers generate multiples and submultiples of the clock frequency.

In known devices for measuring the AC impedance of a battery the measuring circuits and clock generator are either situated in the battery charger (an "intelligent charger"), which can be connected to and disconnected from the battery, or in the battery (an "intelligent battery"), from where information about the state-of-charge of a battery is sent to the battery operated device. Such devices require that the measuring circuits and clock generator are situated in the device with the sole purpose of providing an indication of the state-of-charge of a battery.

Another known method for analysing the AC impedance is voltage/current step response. A current step is applied, and the voltage response over time is analysed. All the required information about battery impedance can be derived from such impedance measurements. Similar information is obtained and state-of-charge can be estimated. The step response method is normally utilized during charging, where an external charger applies the current pulses.

JP 08179017 discloses a method and a circuit for measuring the AC impedance of a battery. U.S. Pat. No. 5,369,364 discloses a method and an apparatus for measuring the state-of-charge of a lithium-iodine battery in an implantable pacemaker.

2. Problems of the Prior Art

There are problems related to all the known methods referred to above.

Simple measurements of battery voltage alone give very limited accuracy in estimating the state-of-charge of the battery. It is difficult to improve the accuracy without extremely complex models of the discharge curve and influence of temperature, current magnitude and previous life of the battery.

A software-based method for estimating the withdrawn capacity introduces minor errors, which are accumulated over time. Deviation from true battery capacity becomes greater at the end of discharge, which is exactly when it is most important to provide accurate information. Assuming an error of eg 10% in estimations based on current measurements for a device having a standby time of 400 h gives an uncertainty of 40 h (almost two days!) in the estimate of the time of shut-off due to end of battery power. Clearly, this is not acceptable.

The current profiles are also becoming more complex. As the number of current scenarios increase, the possibility of tracking all those scenarios is limited. Current measurements are necessary to get a satisfactory accuracy. Unfortunately, current measurements become tougher as stand-by currents decrease. In addition, with long stand-by, the self-discharge of the battery is also significant. Self-discharge cannot be measured and is very complicated to estimate.

As the battery is cycled, ie charged and discharged, or stored at high temperature, its capacity will be reduced. As this method estimates the remaining capacity, it is necessary to know the true battery capacity at the start of the discharge. Otherwise, predicting when there is no remaining capacity is impossible, regardless of how accurate the estimations of used capacity are. Prediction of battery capacity after storage and cycling requires extensive models, frequent temperature measurements and an intelligent battery that remembers its history.

Known impedance measurements, too, have drawbacks. Introducing an additional chip to the battery pack for AC impedance measurements adds cost and size to the battery pack. As the chip must have an internal clock, a clock crystal is added to the battery pack. For large portable applications, this may not be a great problem. However, in small applications where size and cost are major issues, the separate measurement chip in the battery pack is inconvenient.

It is difficult to use this method to continuously monitor the state-of-charge. During stand-by, most functions should be in low power mode and it is not feasible to continuously perform measurements of battery impedance. Every measurement and calculation consumes energy.

Analysis of the response to an applied current or voltage step is difficult to perform in a mobile telephone. As discussed above in connection with AC impedance measurement, the important information is in the frequency region from 1 Hz to 10 kHz. This means that the duration of an applied voltage/current step would have to be in the range of seconds. This is difficult to achieve in a mobile telephone. Shorter duration is not useful.

SUMMARY OF THE INVENTION

The invention uses a simplified AC impedance measurement as a basis for estimations of remaining battery power.

The invention uses a cost reduced AC impedance measurement. Measurements are moved from the battery pack to the telephone. Clock frequencies are already available from clock crystals in the telephone. Consequently, the telephone will use frequencies derived from the clock crystals already existing in the telephone, such as the 32 kHz clock crystal or the 13 MHz clock crystal. The frequencies derived from the existing clock crystals are possibly not the frequencies that give the most accurate impedance measurements. However, by using the components already exiting in a telephone, cost savings can be achieved.

MERITS OF THE INVENTION

The invention provides a simple way to determine the battery state-of-charge in portable devices, in particular in small portable devices such as mobile telephones. The invention makes use of a clock frequency generator existing in the device. It can either be used separately or together with another method for estimating the state-of-charge of the battery, eg calculations of used capacity. This has a certain merit, in particular if the accuracies of the individual methods are not satisfactory. By combining two low cost methods the total accuracy of the system can be raised significantly.

Cost is lower compared to a dedicated chip in the battery pack

The solution is more compact than a dedicated chip in the battery pack,

The solution does not introduce any impedance in the current path to the power amplifier.

The invention can help the software-based estimations to handle self-discharge and ageing of the battery.

DETAILED DESCRIPTION OF A PREFERRED EMBODIMENT OF THE INVENTION

Figure 1:
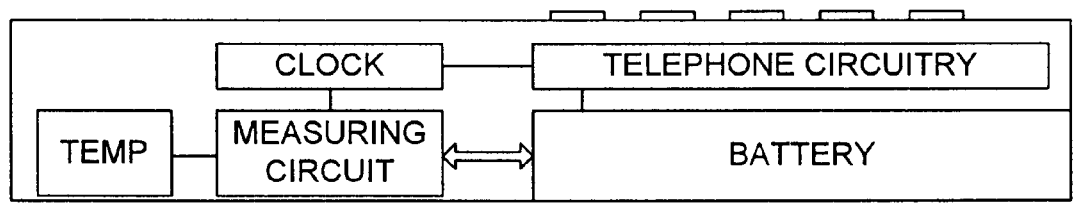
FIG. 1 is a schematic drawing of a mobile telephone utilising the invention.

FIG. 1 shows a mobile telephone with a battery for supplying electric power to the electrical circuits in the telephone. The battery can be removable from the mobile telephone. The mobile telephone has a telephone circuitry and a clock frequency generator, which generates one or more stable clock frequencies for use by the telephone circuitry. The telephone circuitry and the clock frequency generator are of any conventional types used for the known operation of the telephone. For convenience the clock frequency generator is shown as a separate component, but it may also be an integrated part of the telephone circuitry.

A measuring circuit in the telephone applies an AC current to the battery at preferably three or four frequencies, which are derived from the clock frequency. The resulting voltage is measured and analysed by the measuring circuit inside the telephone. Those steps are preferably performed along a route separated from the normal route for current for the battery. Components of the measuring circuit should not introduce any extra impedance in the path from battery to the power amplifier.

By performing the measurement at different frequencies, a complex impedance plot can be made. This has been done in FIG. 2, where the two components of the AC impedance have been drawn for a fully charged battery. The abscissa represents the real part of the AC impedance, and the ordinate represents the imaginary part. At low frequencies both the real part and the imaginary part of the AC impedances are high, and at high frequencies both the real part and the imaginary part of the AC impedances are low.

From the highest frequencies the impedance curve exhibits a generally vertical rise, where the real part of the AC impedance is almost constant. At lower frequencies the curve bends and has a more horizontal intermediate portion, and at the lowest frequencies the AC impedance curve rises diagonally. The intermediate portion is of particular interest and can roughly be described as comprising two semicircles or generally circular arcs C1 and C2. The significance of this will become more apparent in the following.

Figure 3:
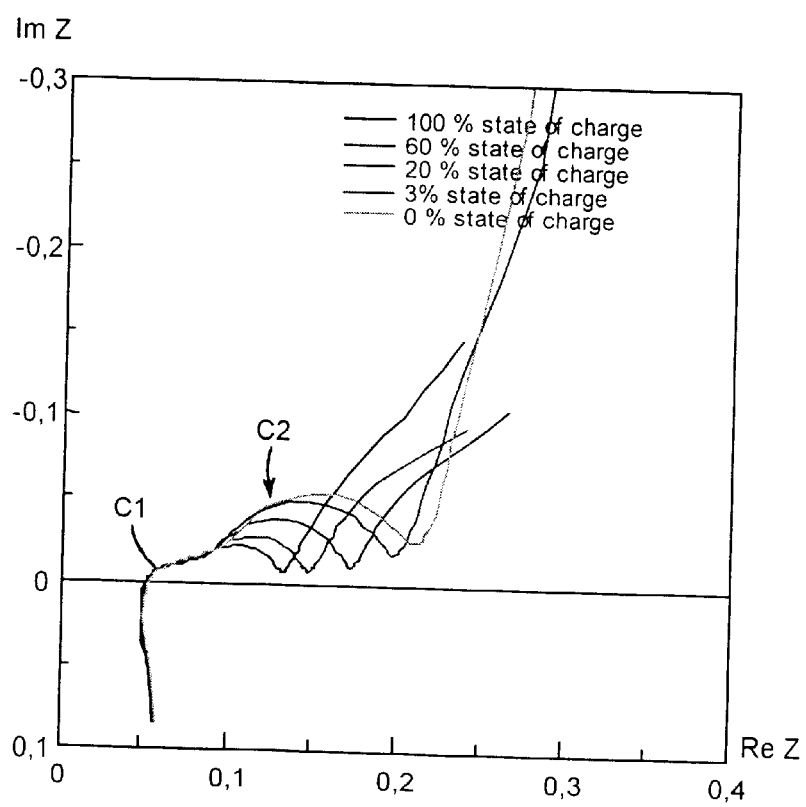
FIG. 3 is an AC impedance plot for the battery in FIG. 1 with curves drawn for several levels of state-of-charge.

The shape of the complex AC impedance curve changes with the state-of-charge of the battery. The influence of state-of-charge is illustrated in FIG. 3 where AC impedance curves have been drawn for five different states of charge, ranging from a fully charged battery to a fully discharged battery. It will clearly be seen that when the battery discharges, the radius of the second semicircle C2 increases. This change is characteristic for several generally used rechargeable batteries and forms the basis for the method of predicting the state-of-charge using impedance measurements.

Figure 4:
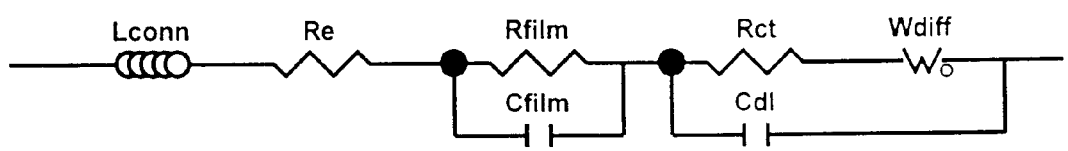
FIG. 4 is an equivalent circuit model of the battery.
Figure 2:
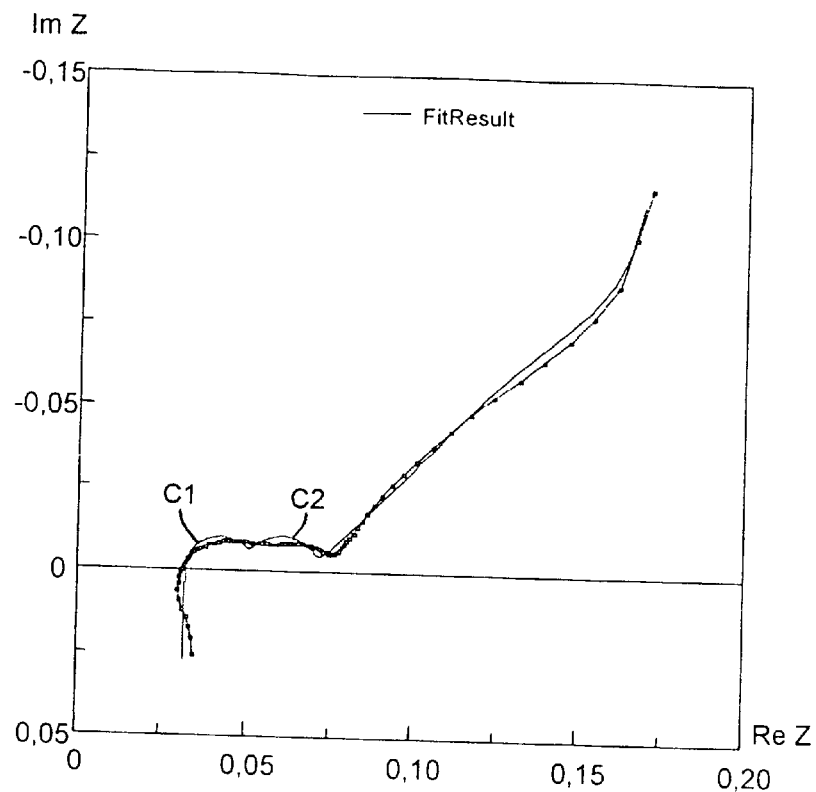
FIG. 2 is an AC impedance plot for a fully charged battery.

To facilitate the description of different characteristics, the equivalent circuit model shown in FIG. 4 can be used to describe the battery schematically. In FIG. 2 simulated data from this equivalent circuit model in FIG. 4 are plotted together with actually measured values. The fit is rather accurate and the error is less than 3% for any one component of the circuit model in FIG. 4, which indicates the good accuracy of the circuit model.

Translated to the equivalent circuit model, the increase of the radius of the second semicircle C2 represents an increase in the charge-transfer resistance Rct of the battery. The other components in the equivalent circuit model remain substantially unchanged. Estimating the charge-transfer resistance Rct of the battery is thus equivalent to estimating the radius of the second semicircle C2, and by estimating the radius of the second semicircle C2, the state-of-charge can be estimated. For best results, however, this requires that the radius for a fully charged battery is known. The radius of C2 for a fully charged battery can either be communicated to the measuring device from an intelligent battery, or the measuring device itself can perform a measurement of the radius of the second semicircle C2 when the battery is fully charged.

A complete measurement, which gives all the data points in FIG. 3, takes a relatively long time and is neither feasible nor necessary in a practical application. The method of the invention uses selected frequencies, which are derived from the clock frequency generator of the telephone, and which are useful for characterizing the change of the radius of the second semicircle C2. Data points in the second semicircle C2 represent frequencies only in a reduced frequency range, eg from approximately 1 Hz to 10 kHz, and only data pertaining to the second semicircle C2 need be measured, since it essentially depends on and reflects the charge-transfer resistance Rct of the battery. Depending on frequency, a single measurement typically takes only milliseconds or seconds to perform. By selecting a limited number of frequencies, eg three or four, the state-of-charge can be determined by an accuracy of less than 5%. The entire measurement can thus be completed in just a few seconds.

In the state-of-the-art methods, measurements are performed using a specially designed chip included in the battery pack, a so-called intelligent battery. This method requires a separate clock that supplies the necessary frequencies for the measurements.

Best accuracy is obtained if the actual full capacity of the battery is known, and impedance measurements are compared to or normalized against impedance values of a fully charged battery. Impedance measurements may be performed on the fully charged battery immediately after termination of a charging cycle, or at predetermined intervals. Usually the telephone controls the charging of the battery, and when the battery is fully charged, the telephone can initiate a measurement of the AC impedance of the fully charged battery and store the values thus measured. Subsequent data are normalized against the stored data for the fully charged battery. Effects of possible ageing of the battery are hereby eliminated, since the AC impedance of the fully charged battery is measured at the end of each charging or at predetermined intervals.

The battery impedance depends on temperature, and temperature information is therefore used to obtain more accurate estimates of the state-of-charge of the battery. A temperature sensor supplies a temperature dependent signal to the measuring circuit, and when estimating the state-of-charge of the battery the measuring circuit makes a correction for the temperature dependence of the impedance. Thereby accuracy is increased. The frequency from the clock crystal is also frequency dependent, and many mobile telephones therefore include a temperature sensor giving a temperature dependent signal, which is used to compensate for the temperature dependency of the clock frequency in order to stabilise the clock frequency and reduce or eliminate the temperature dependency of the clock frequency. The temperature dependent signal from the same temperature sensor is also used to compensate the estimation of the state-of-charge of the battery.

By moving all functions from the battery pack to the telephone, many discrete components, which were previously included in the battery pack, can be omitted, in particular the clock frequency crystal and related components. In the telephone, it is possible to implement the impedance measurement function as a part of eg a power management chip. The exact location of the function is not important; it can be in any of the chips in a future telephone chipset. Costs of the required changes should be limited compared to adding a separate chip in the battery pack.

In principle, DC impedance measurements can provide the same information. However, this is not part of the present invention.

Use of the Information from Impedance Measurements

There are several compromises in hardware using the integrated solution compared to dedicated devices, eg in clock frequency, measurement accuracy, etc. Consequently, it might not be possible to get a 5% accuracy. Real accuracy has to be estimated at a later stage. If the accuracy is not good enough as the only source of information, impedance measurements have many virtues as a complement to software/hardware capacity estimations.

A feasible method is to use software-based fuel gauging, ie estimating remaining capacity, and to aid those estimations with the impedance method at regular intervals. After eg every 10% loss in capacity, an impedance measurement is performed. Data from this measurement is used to correct or update the previously obtained information.

Another possible solution is to use an impedance measurement at the end of discharge. Accurate fuel gauging information is particularly important at that stage. If there are errors of ±40 h in stand-by, an impedance measurement can be performed when software-based estimations indicate that there is eg 60 h left. This would clearly facilitate a low battery indicator and estimations of remaining capacity. Contrary to estimations of used capacity, errors in impedance measurements are not greater at the end of discharge.

Extended cycling and high temperature storage degrade performance and leads to capacity losses. This has to be considered in software based fuel gauging. If the capacity of a fully charged battery is not known, it is impossible to estimate remaining capacity, regardless of how accurately used capacity is calculated.

The same mechanisms that lead to capacity losses increase the impedance of the battery. This information can be used to solve some of the difficulties of cycled batteries.

If the battery is not removed from the telephone, the increase in impedance with time can be used to estimate the capacity loss in the battery due to cycling and high temperature storage. This would eliminate the need for extensive models to estimate the deterioration, depending on temperature and state-of-charge.

If the battery is removed and another battery is connected, the telephone can assume that the capacity is identical if the impedance is similar. If a new battery with another capacity rating is connected, the impedance measurement can be used to re-calibrate the true capacity. If the mismatch between estimated state-of-charge from impedance measurement and software estimations is too big, the telephone will assume that the original estimated capacity is erroneous and only display relative capacity values (in percentage).

A drawback of the telephone-integrated solution is that chip and battery are possibly not perfectly matched. If the function is implemented in a battery pack, it can store data regarding the behaviour of this specific battery. This would increase the accuracy of the measurements. In a telephone, it is possible to send battery information from the battery pack to the telephone. This requires an intelligent battery, which adds to the cost of the pack. The invention can be used both with and without intelligent battery packs.

What is claimed is:

1. A battery operable electrical device comprising:
    a clock frequency generator operable to generate electrical signals with a predetermined clock frequency;
    a first electrical circuit adapted to perform a first function utilizing the electrical signals generated by the clock generator;
    a second electrical circuit adapted to generate an electrical excitation signal derived from the electrical signals generated by the clock generator, the excitation signal having an excitation frequency derived from the clock frequency,
    means for feeding the excitation signal to battery terminals of the device,
    wherein the second electrical circuit is adapted to receive, from a battery connected to the battery terminals, an electrical signal in response to the excitation signal, and to analyze a received signal for the battery impedance at the excitation frequency and, based on the battery impedance, to estimate the state-of-charge of the battery.

2. An electrical device according to claim 1, wherein the second electrical circuit is adapted to generate a plurality of electrical excitation signals having excitation frequencies derived from the clock frequency, and to receive, from a battery connected to the battery terminals, a plurality of response signals in response to the plurality of excitation signals, and to analyse the plurality of response signals for the battery impedance at the excitation frequencies and, based on the battery impedances, to estimate the state-of-charge of the battery.

3. An electrical device according to claim 1, wherein the second electrical circuit is adapted to detect a fully charged condition of a battery connected to the battery terminals.

4. An electrical device according to claim 3, wherein the detected fully charged condition of the battery is taken into account in the estimation of the state-of-charge of the battery.

5. An electrical device according to claim 1, further comprising a temperature sensor adapted to supply a temperature dependent signal to the second electrical circuit, and wherein the temperature dependent signal is taken into account in the estimation of the state-of-charge of the battery.

6. An electrical device according to claim 1, wherein the device is a mobile telecommunications device.

7. An electrical device according to claim 6, wherein the mobile telecommunications device is a mobile telephone.

* * * * *